US012300332B2

(12) United States Patent
Lee et al.

(10) Patent No.: US 12,300,332 B2
(45) Date of Patent: May 13, 2025

(54) RESUMPTION OF PROGRAM OR ERASE OPERATIONS IN MEMORY

(71) Applicant: Micron Technology, Inc., Boise, ID (US)

(72) Inventors: Eric N. Lee, San Jose, CA (US); Dheeraj Srinivasan, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/369,479

(22) Filed: Sep. 18, 2023

(65) Prior Publication Data

US 2024/0006001 A1  Jan. 4, 2024

Related U.S. Application Data

(63) Continuation of application No. 17/951,754, filed on Sep. 23, 2022, now Pat. No. 11,763,900, which is a continuation of application No. 17/102,876, filed on Nov. 24, 2020, now Pat. No. 11,456,039.

(51) Int. Cl.
| | |
|---|---|
| *G11C 16/26* | (2006.01) |
| *G11C 7/10* | (2006.01) |
| *G11C 16/10* | (2006.01) |
| *G11C 16/34* | (2006.01) |

(52) U.S. Cl.
CPC ........ *G11C 16/3436* (2013.01); *G11C 7/1057* (2013.01); *G11C 7/1084* (2013.01); *G11C 16/10* (2013.01); *G11C 16/26* (2013.01)

(58) Field of Classification Search
CPC . G11C 16/3436; G11C 7/1057; G11C 7/1084; G11C 16/10; G11C 16/26; G11C 16/0483; G11C 7/22; G11C 16/32; G11C 2216/20; G11C 16/14; G06F 13/1668
See application file for complete search history.

(56) References Cited

U.S. PATENT DOCUMENTS

| | | |
|---|---|---|
| 9,021,158 B2 | 4/2015 | Hyun et al. |
| 9,223,514 B2 | 12/2015 | Hyun et al. |
| 9,293,206 B2 | 3/2016 | Nam |
| 9,443,600 B2 | 9/2016 | Ghalam et al. |
| 11,158,645 B2 | 10/2021 | Yamaguchi et al. |
| 2009/0225603 A1 | 9/2009 | Chun et al. |
| 2012/0167100 A1 | 6/2012 | Li |
| 2021/0142855 A1* | 5/2021 | Na .......................... G11C 16/16 |

* cited by examiner

*Primary Examiner* — Xiaochun L Chen
(74) *Attorney, Agent, or Firm* — Brooks, Cameron & Huebsch, PLLC

(57) ABSTRACT

A system includes a memory component and a processing device, operatively coupled with the memory component, to send a read command to the memory component while a program or erase operation being executed by the memory component is suspended. The processing device, operatively coupled with the memory component, can then send an auto resume command to the memory component to automatically resume execution of the program or erase operation after the read command is executed.

17 Claims, 7 Drawing Sheets

RESUMPTION OF PROGRAM OR ERASE OPERATIONS IN MEMORY

PRIORITY INFORMATION

This application is a Continuation of U.S. application Ser. No. 17/951,754, filed on Sep. 23, 2022, which is a Continuation of U.S. application Ser. No. 17/102,876, filed on Nov. 24, 2020, which issued as U.S. Pat. No. 11,456,039 on Sep. 27, 2022, the contents of which are incorporated herein by reference.

TECHNICAL FIELD

Embodiments of the disclosure relate generally to memory sub-systems, and more specifically, relate to resumption of program or erase operations in memory.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to resumption of program or erase operations in memory. A memory sub-system can be a storage system, storage device, a memory module, or a combination of such. An example of a memory sub-system is a storage system such as a solid-state drive (SSD). Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A read command can be sent to, and executed by, a storage device of a memory sub-system while another memory operation (e.g., a program, erase, or other memory operation) being performed by the memory device is suspended. In a conventional memory sub-system, the read command can automatically trigger a resumption of the other operation, causing a drain of page buffer resources in the memory sub-system. For example, the same page buffer resources used to resume the other memory operation can also be used to execute the read command (e.g., to transfer the read data), creating a conflict between executing the read command and executing the other memory operation. A memory sub-system traditionally may not have the resources to support the resumption of the other memory operation concurrently with the read data transfer.

Aspects of the present disclosure address the above and other deficiencies by sending an auto resume command to the memory component (e.g., storage device) such that the other memory operation does not resume until an auto resume command is received and the read command is executed. A resume continuation command can also be sent after the read command has been executed, when page buffer resources are to be used. The resume continuation can resume the memory operation responsive to whether a checkpoint for resuming the memory operation has been met.

The auto resume command allows for the execution of read commands while the other memory operation is suspended and there are not enough page buffer resources to execute both the read command and the other memory operation. As such, issuing a read command will not automatically trigger a resumption of memory operations and as such, page buffer resources can be used more efficiently. The resume continuation command also allows for more effective use of page buffer resources because the page buffer resources are not activated until used. In some embodiments, after the read command has been executed, the resume continuation command can pause the memory operation until a checkpoint is reached. A checkpoint is triggered responsive to a request for page buffer resources. Therefore, page buffer resources are not used until requested.

Figure 1:
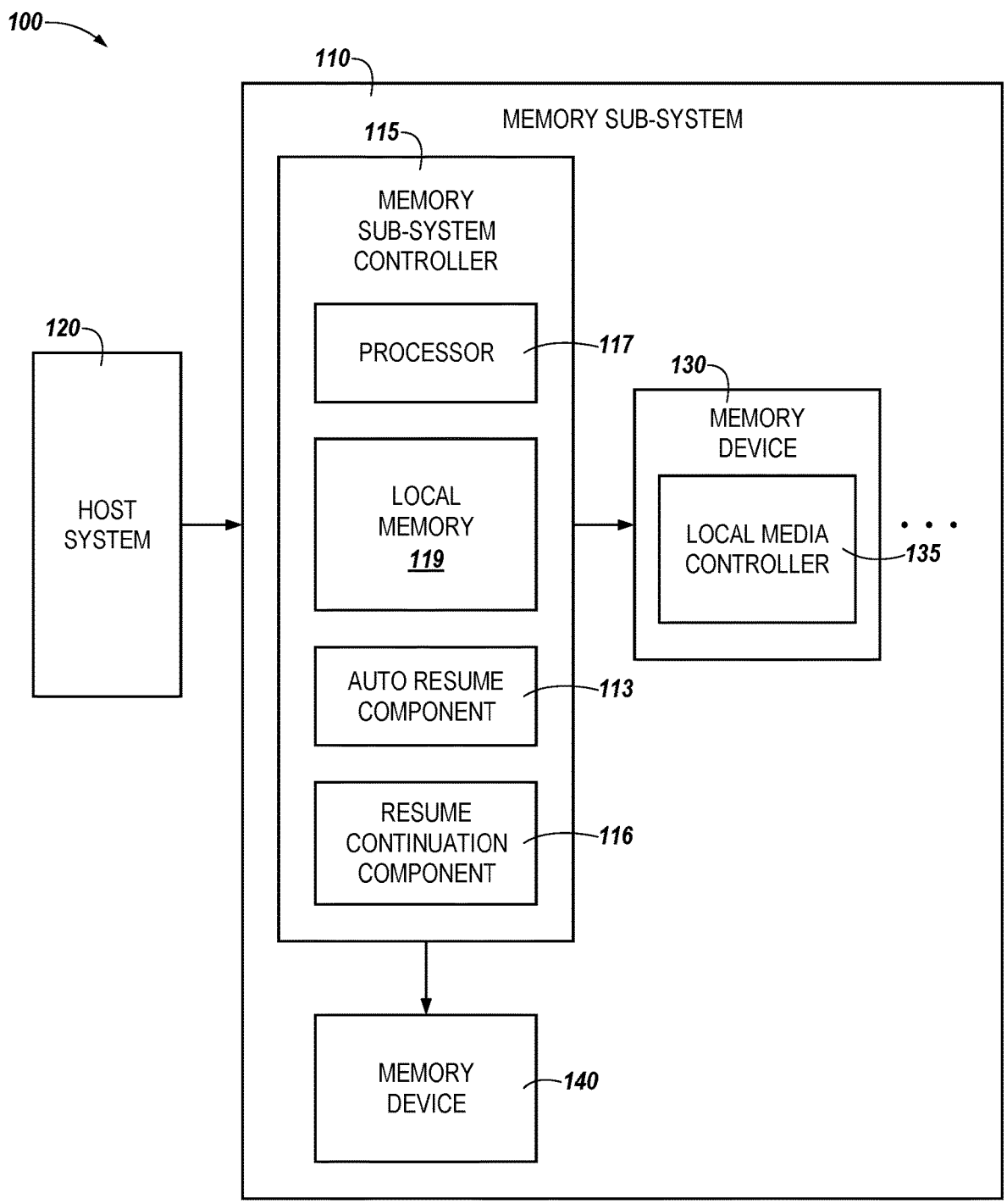
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs). The memory sub-system 110 can include one or more memory components that store data. The memory components can be, for example, non-volatile memory components and volatile memory components. In general, a host system can utilize a memory sub-system 110 to store data at the memory components and to retrieve data from the memory components.

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

An example of non-volatile memory devices (e.g., memory device 130) includes a negative-and (NAND) type flash memory. Each of the memory devices 130 can include one or more arrays of memory cells. The memory cells can include single level cells (SLCs) that can store one bit per cell, multi-level cells (MLCs) that can store two bits per cell, (e.g., triple level cells (TLCs) that can store three bits per cell, quad-level cells (QLCs) that can store four bits per cell, and/or penta-level cells (PLCs) that can store five bits per cell, among others. As used herein, the term multiple level cells is used to refer to cells configured to store more than one bit per cell (e.g., MLC, TLC, QLC, PLC, etc.). In some embodiments, a particular memory component can include an SLC portion, and an MLC portion, a TLC portion, a QLC portion, and/or a PLC portion of memory cells. Each of the memory cells can store one or more bits of data used by the host system 120. Furthermore, the memory cells of the memory devices 130 can be grouped as memory pages or memory blocks that can refer to a unit of the memory component used to store data.

Although non-volatile memory components such as NAND type memory (e.g., 2D NAND, 3D NAND) are described, the memory device 130 can be based on any other type of non-volatile memory or storage device, such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include an auto resume component 113. Although not shown in FIG. 1 so as to not obfuscate the drawings, the auto resume component 113 can include various circuitry to facilitate continuing the suspension of memory operations (e.g., program or erase operations) unless an auto resume command is received by memory device 130. For example, the execution of a read command sent to the memory device will not trigger a resumption of a suspended program or erase operation by memory device 130 unless an auto resume command has been received by the memory device, as will be further described herein. The auto resume component 113 can include a special purpose circuitry in the form of an ASIC, FPGA, state machine, and/or other logic circuitry that can allow the auto resume component 113 to orchestrate and/or perform the operations described herein.

The memory sub-system 110 can also include a resume continuation component 116. Although not shown in FIG. 1 so as to not obfuscate the drawings, the resume continuation component 116 can include various circuitry to facilitate confirming a resume continuation command has been received by memory device 130. For example, the memory device 130 can resume execution of a memory operation (e.g. a program or erase operation) responsive to receiving the resume continuation command prior to, or subsequent to, a checkpoint for resuming the operation being met, as will be further described herein. The checkpoint can correspond to page buffer resources being sought for execution of a memory operation. The resume continuation component 116 can include a special purpose circuitry in the form of an ASIC, FPGA, state machine, and/or other logic circuitry that can allow the resume continuation component 116 to orchestrate and/or perform the operations described herein.

In some embodiments, the memory sub-system controller 115 includes at least a portion of the auto resume component 113 and the resume continuation component 116. For example, the memory sub-system controller 115 can include a processor 117 (processing device) configured to execute instructions stored in local memory 119 for performing the operations described herein. In some embodiments, the auto resume component 113 and the resume continuation component 116 are part of the host system 110, an application, or an operating system As an example, controller 115 can send a read command to memory device 130 while a program or erase operation being executed by memory device 130 is suspended, and auto resume component 113 can send an auto resume command to memory device 130 to automatically resume execution of the program or erase operation after the read command is executed. The auto resume command can be sent by auto resume component 113 before or after the read command is sent to memory device 130. For instance, the auto resume command can be sent any time during the execution of the read command. In one example where the auto resume command is sent to memory device 130 after the read command is sent to the memory device 130, the memory device 130 is given a longer period to execute the read command than an example where the auto resume command is sent to the memory device 130 before the read command. Execution of the suspended program or erase operation may only resume after execution of the read command, and the data read during execution of the read command can be transferred to controller 115 while the execution of the suspended program or erase operation has resumed (e.g., concurrently with the execution of the program or erase operation).

The resumption of the program or erase operation execution can be temporary. For example, the memory device 130 can confirm if a resume continuation command has been received from the resume continuation component 116. The memory device 130 can resume (e.g., continue resumption of) execution of the program or erase operation responsive to confirming that the resume continuation has been received and that a checkpoint for resuming the operation has been met. The checkpoint for resuming the operation can correspond to, for instance, an amount of page buffer resources being used by the memory device 130. The resume continuation command can be sent before or after the memory device 130 has confirmed whether it has received the resume continuation command. For instance, the confirmation of the resume continuation command can be responsive to page buffer resources being used by the memory device 130. In an example where the resume continuation command is sent after memory device 130 has confirmed the resume continuation command has been received and the checkpoint for resuming the operation has not been met, the memory device 130 can pause execution of the program or erase operation.

The paused program or erase operation can be resumed responsive to receiving the resume continuation command.

During suspension of a program or erase operation, the memory device 130 can ensure received read commands do not trigger a complete resumption of the program or erase operation before confirming if a resume continuation command has been received. For example, memory device 130 can temporarily resume execution of the program or erase operation after the auto resume command has been sent, while the data during execution of the read command is being transferred and prior to the resume continuation component 116 sending the resume continuation command. The execution of the read command and the execution of the program or erase operation can occur consecutively to increase bandwidth efficiency of the memory component and will not occur in parallel until the auto resume command has been received by the memory device 130. The program or erase operation may not resume without the auto resume command being sent by the auto resume component 113.

Figure 2:
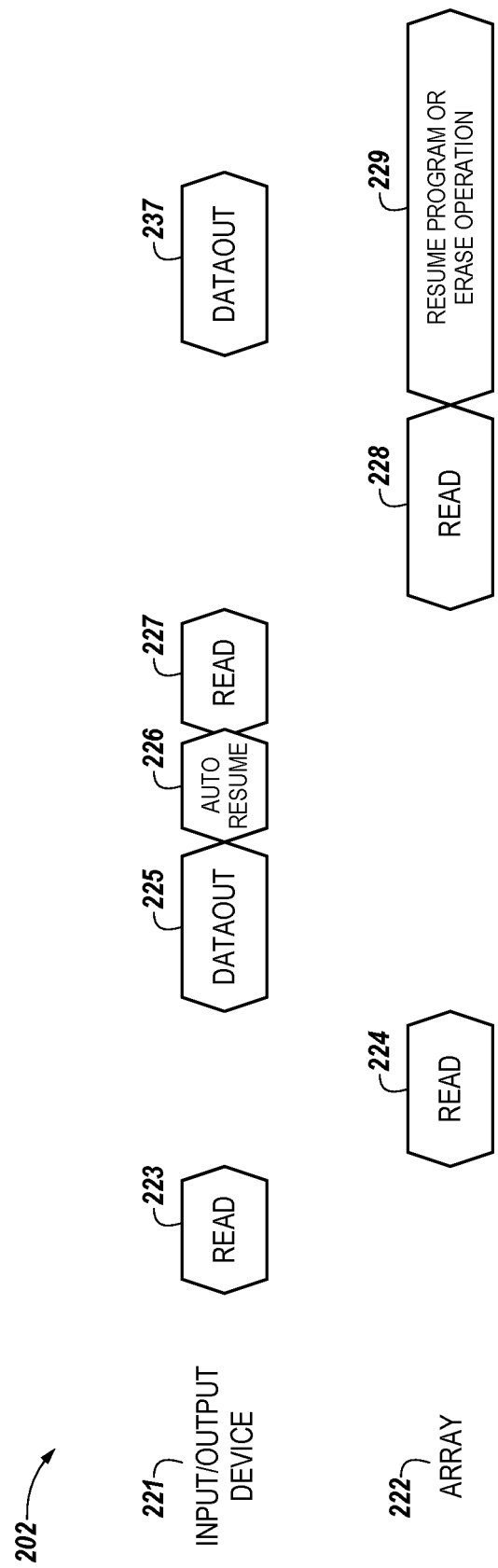
FIG. 2 is a flow diagram of a process to resume program or erase operations in memory in accordance with some embodiments of the present disclosure.

FIG. 2 is a flow diagram of a process 202 to resume program or erase operations in memory in accordance with some embodiments of the present disclosure. The process 202 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the process 202 is performed by and/or utilizing the auto resume component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

A computing system can include a memory component (e.g. memory device 130 of FIG. 1) and a processing device (e.g., controller 115 of FIG. 1), among other components. The memory component can include a read buffer, a write buffer, a memory array 222, and/or an input/output (I/O) device 221.

In process 202, a program or erase operation can be suspended while a read command 223 is sent from the processing device to array 222 via the I/O device 221. The read command can be received by the memory array 222 and executed 224. For example, data 225 can be read from array 222 and sent to the processing device via the I/O device 221. However, the suspended program or erase operation does not automatically resume after execution 224 of the read command. Further, although not shown in FIG. 2, multiple read commands can be sent from the processing device to the memory array 222 for execution in a similar manner.

To restore the program or erase operation from its suspended state, an auto resume command 226 can be sent to memory array 222 from the processing device via I/O device 221 prior to sending the last read command 227. The auto resume command 226 can signal the array 222 such that the array can automatically resume execution of the suspended program or erase operation after the last read command has been executed 228. The memory array 222 can execute 228 the last read command and send the read data 237 back to the processing device via I/O device 221. Execution of the suspended program or erase operation can then be resumed 229 by the memory array 222 after executing the last read command. For instance, the execution of the suspended program or erase operation may only be resumed after executing 228 the last read command 227 that was sent after sending the auto resume command 226. Further, the execution of the suspended program or erase operation can be resumed 229 while the read data 237 is being sent to the processing device via I/O device 221.

Figure 3:
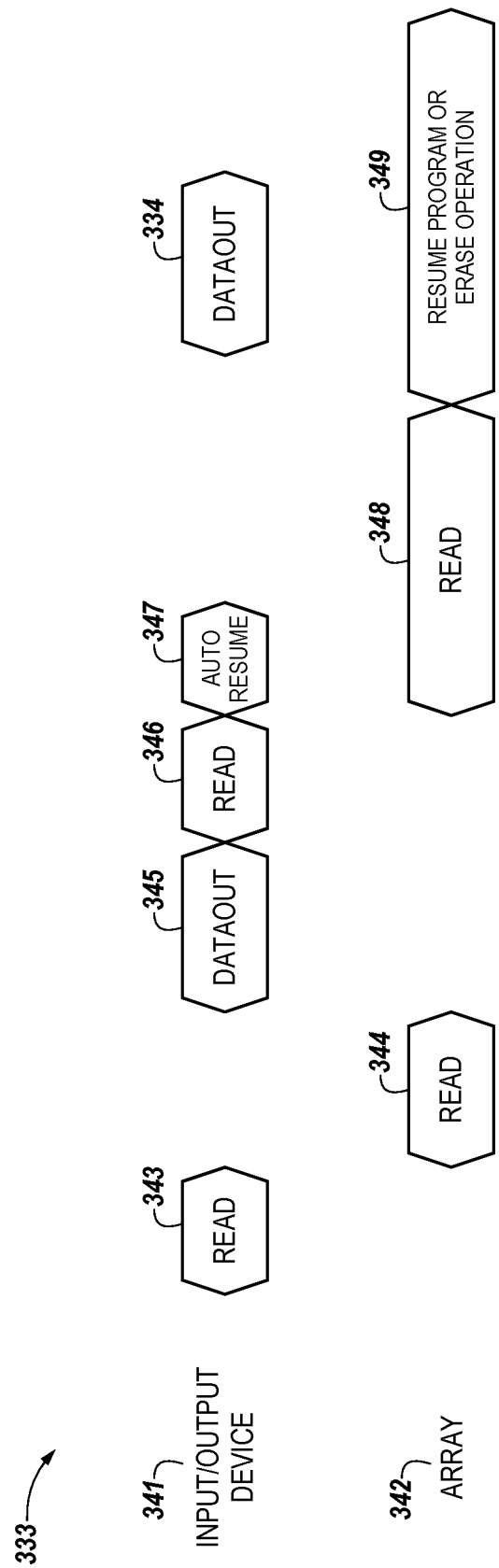
FIG. 3 is a flow diagram of a process to resume program or erase operations in memory in accordance with some embodiments of the present disclosure.

FIG. 3 is a flow diagram of a process 333 to resume program or erase operations in memory in accordance with some embodiments of the present disclosure. The process 333 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the process 333 is performed by and/or utilizing the auto resume component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 3, the process 333 can involve an input/output (I/O) device 341 which can be analogous to input/output (I/O) device 221 illustrated in FIG. 2. The process 333 can also involve a memory array 342, which can be analogous to memory array 222 of FIG. 2.

In process 341, a program or erase operation can be suspended while a read command 343 is sent from the processing device to memory array 342 via the I/O device 341. The read command can be received by the memory array 342 and executed 344. For example, data 345 can be read from array 342 and sent to the processing device via the I/O device 341. However, the suspended program or erase operation does not automatically resume after execution 344 of the read command. Further, although not shown in FIG. 2, multiple read commands can be sent via the I/O device 341 to the memory array 342 for execution in a similar manner.

To restore the program or erase operation from its suspended state, an auto resume command 347 can be sent to memory array 342 via I/O device 341 after the last read command 346 has been sent to the memory array 342. The auto resume command 347 can signal the array 342 to automatically resume execution of the suspended program or erase operation after the last read command has been executed 348. The memory array 342 can execute 348 the last read command and send the read data 334 back to the processing device via I/O device 341. The last read command 346 can be executed 348 for a longer time by the memory array 342 than if the auto resume command were sent prior to the last read command (e.g., as illustrated in FIG. 2) because the last read command 346 can begin to be executed immediately after being sent. Further, the auto resume command 347 can be sent to array 342 at any point during the execution 348 of the last read command. Execution of the suspended program or erase operation can then be resumed 349 by the memory array 342 after executing the last read command 346. For instance, the execution of the suspended program or erase operation may only be resumed after executing 348 the last read command 346 that was sent prior to sending the auto resume command 347. Further, the execution of the suspended program or erase operation can be resumed 349 while the read data 334 is being sent to the processing device via I/O device 341.

Figure 4:
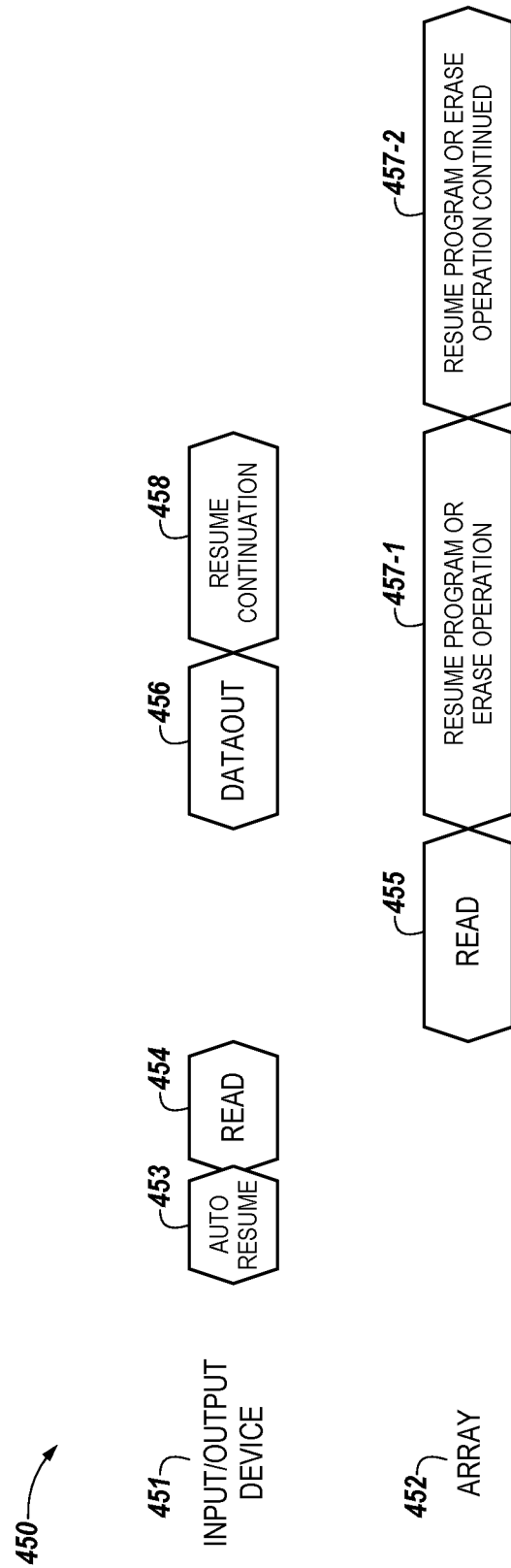
FIG. 4 is a flow diagram of a process to resume program or erase operations in memory in accordance with some embodiments of the present disclosure.

FIG. 4 is a flow diagram of a process 450 to resume program or erase operations in memory in accordance with some embodiments of the present disclosure. The process 450 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the process 450 is performed by and/or utilizing the resume continuation component 116 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 4, the process 450 can involve an input/output (I/O) device 451 which can be analogous to I/O device 221 and I/O device 341 illustrated in FIG. 2 and FIG. 3 respectively. The process 450 can also involve memory array 452, which can be analogous to memory array 222 and memory array 342 of FIG. 2 and FIG. 3 respectively.

A computing system can include a memory component (e.g., memory device 130 of FIG. 1) and a processing device (e.g., controller 115 of FIG. 1), among other components. The memory component can, can include a read buffer, a write buffer, a memory array 452, and/or an input/output (I/O) device 451.

In process 450, a program or erase operation can be suspended while a read command 454 is sent from the processing device to memory array 452 via the I/O device 451. An auto resume command 453 can accompany the last read command 454 to the memory array 452. The auto resume command 453 can be sent with (e.g., accompany) the read command 454 sent to the memory array 452. The auto resume command 453 can signal the memory array 452 to automatically resume execution of the suspended program or erase operation after read command 454 has been executed 455. The read command 454 can be sent by the I/O device 451 to be executed. The memory array 452 can execute 455 the read command 454 and send the read data 456 back to the processing device via I/O device 451. As illustrated in FIG. 4, the auto resume command 453 is sent prior to read command 454. However, embodiments are not so limited and, in another embodiment, the auto resume command 453 can be sent after the read command 454.

Execution of the suspended program or erase operation 457-1 can be temporarily resumed by the memory array 452 after the read command 454 has been executed 455 and while the read data 456 is being sent to the processing device via I/O device 451. A resume continuation command 458 can be sent from the processing device to memory array 452 via I/O device 451 after the read data 456 has been sent to the processing device. As such, the execution 455 of the read command 454 and the execution of the program or erase operation 457-1 occur consecutively, such that both do not occur at the same time.

In process 451, resume continuation command 458 is sent prior to a checkpoint being met. Upon confirming the checkpoint has been met, memory array 452 can continue to execute the program or erase operation 457-2. The checkpoint can correspond to a request for page buffer resources by the memory array 452. For instance, the checkpoint can correspond to an amount of page buffer resources being used, requested, or to be used. The execution 455 of the read command 454 and the execution of the program or erase operation 457 occurring consecutively can increase efficiency in management of page buffer resources and bandwidth efficiency. For instance, page buffer resources may not be activated until the checkpoint has been met.

Figure 5:
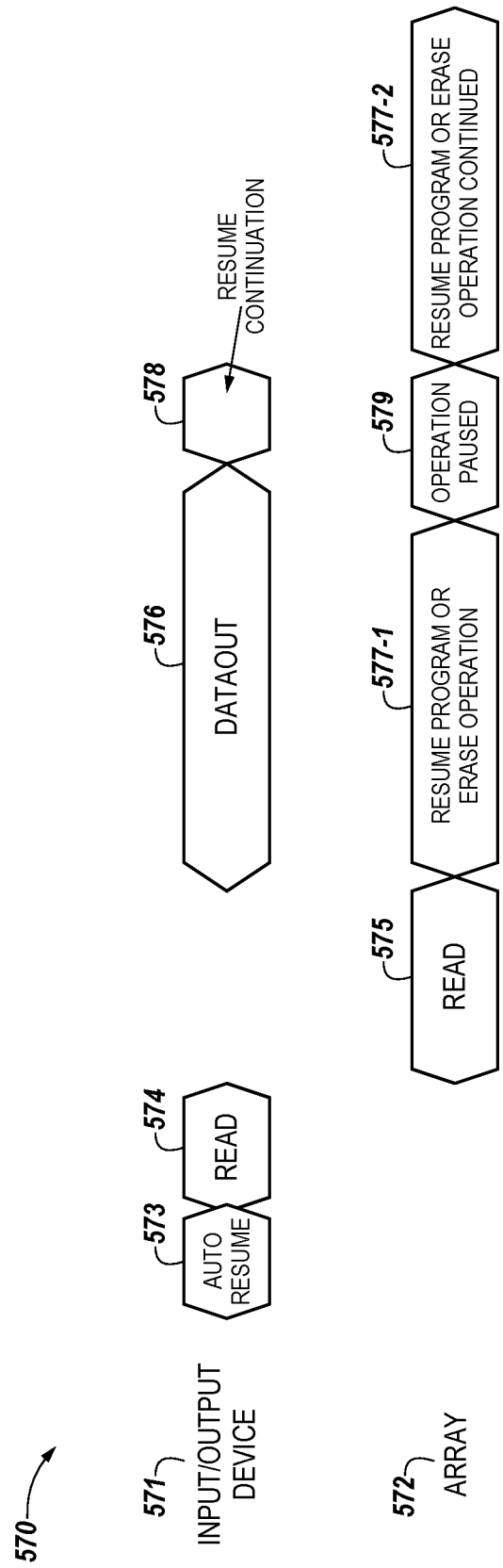
FIG. 5 is a flow diagram of a process to resume program or erase operations in memory in accordance with some embodiments of the present disclosure.

FIG. 5 is a flow diagram of a process 570 to resume program or erase operations in memory in accordance with some embodiments of the present disclosure. The process 570 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the process 570 is performed by and/or utilizing the resume continuation component 116 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 5, the process 570 can involve an input/output (I/O) 571 which can be analogous to I/O device 221, I/O device 341, and I/O device 451 illustrated in FIG. 2, FIG. 3, and FIG. 4 respectively. The process 570 can also involve memory array 572, which can also be analogous to memory array 222, memory array 342, and memory array 452 of FIG. 2, FIG. 3, and FIG. 4 respectively.

In process 570, a program or erase operation can be suspended while a read command 574 is sent from the processing device to memory array 572 via the I/O device 571. The processing device can send an auto resume command 573 along with read command 574 to the memory array 572. The auto resume command 573 can signal the memory array 572 to automatically resume execution of the suspended program or erase operation after read command 574 has been executed 575. The read command 574 can be sent by the I/O device 571 to be executed. The memory array 572 can execute 575 the read command 574 and send the read data 576 to the processing device via I/O device 571. As illustrated in FIG. 5, the auto resume command 573 is sent prior to read command 574. However, embodiments are not so limited and, in another embodiment, the auto resume command 573 can be sent after the read command 574.

Execution of the suspended program or erase operation 577-1 can be temporarily resumed by the memory array 572 after the read command 574 has been executed 575 and while the read data 576 is being sent to the processing device via I/O device 571. A resume continuation command 578 can be sent from the processing device to memory array 572 via I/O device 571 after the read data 576 has been sent to the processing device. For instance, the read data 576 can continue to be sent to the processing device until a resume continuation command 578 is received.

In process 570, the resume continuation command 578 is sent after a checkpoint is met. Upon confirming the checkpoint has been met, but before receiving the resume continuation command 578, memory array 572 can temporarily pause 579 the program or erase operation. The checkpoint can correspond to a request for page buffer resources by the memory array 572. For instance, the checkpoint can correspond to an amount of page buffer resources being used, requested, or to be used. Once the checkpoint is met, and the resume continuation command 578 is received, memory array 572 can continue 577-2 the program or erase operation. That is, the program or erase operation is only continued 577-2 responsive to meeting the checkpoint and receiving the resume continuation command 578.

Figure 6:
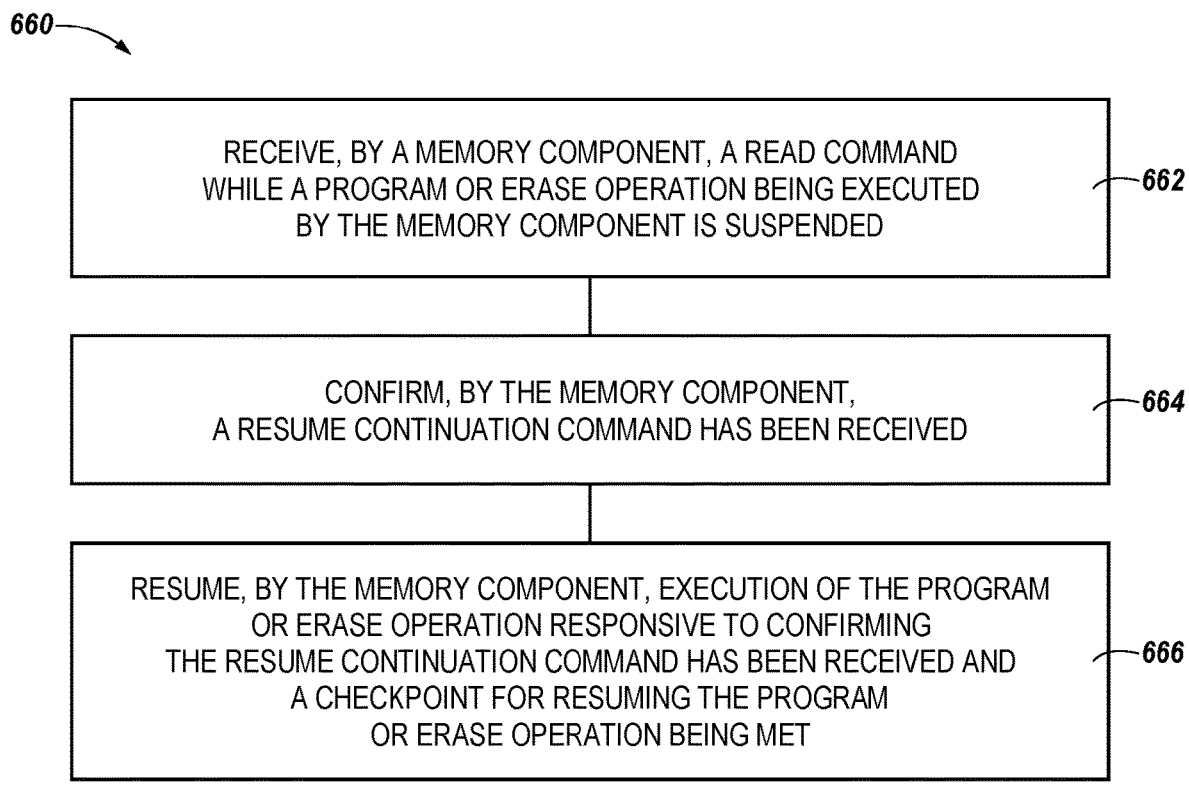
FIG. 6 is a flow diagram of an example method to resume program or erase operations in memory in accordance with some embodiments of the present disclosure.

FIG. 6 is a flow diagram of an example method 660 to resume program or erase operations in memory in accordance with some embodiments of the present disclosure. The method 660 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 660 is performed by and/or utilizing the resume continuation component 116 of FIG. 1 and/or the resume continuation component 716 of FIG. 7. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 662, a memory component receives a read command while a program or erase operation being executed by the memory component is suspended. For instance, a processing device (e.g., the processor 117 illustrated in FIG. 1, herein) can send the read command to the memory component. The memory component can receive the read command while a program or erase operation is suspended. The received read command does not automatically resume the suspended program or erase operation.

At operation 664, the memory component confirms a resume continuation command has been received. In one embodiment, the resume continuation command can be confirmed after receiving the resume continuation command. In another embodiment, the memory component can seek to confirm if the resume continuation command has been received prior to receiving the resume continuation command. The resume continuation command can be sent to the memory component after the execution of a last read command.

At operation 667, the memory component resumes execution of the program or erase operation responsive to confirming the resume continuation command has been received and a checkpoint for resuming the program or erase operation has been met. The suspended program or erase operation can be temporarily resumed by the memory component after the execution of a last read command. A resume continuation command can be received by the memory component after the execution of the last read command. If a resume continuation command is sent prior to the checkpoint being met, the resumption of the program or erase operation can be continued. If the resume continuation command is sent after the checkpoint is met, the resumption of the program or erase operation would have been temporarily paused once the checkpoint was met, but can then be continued once the resume continuation command is sent. The checkpoint can correspond to a request for page buffer resources by the memory array. For instance, the checkpoint can correspond to an amount of page buffer resources being used, requested, or to be used. Once the checkpoint is met, and the resume continuation command is confirmed to have been previously received, the program or erase operation can be resumed. For instance, the program or erase operation may only be resumed responsive to meeting the checkpoint and receiving the resume continuation command.

Figure 7:
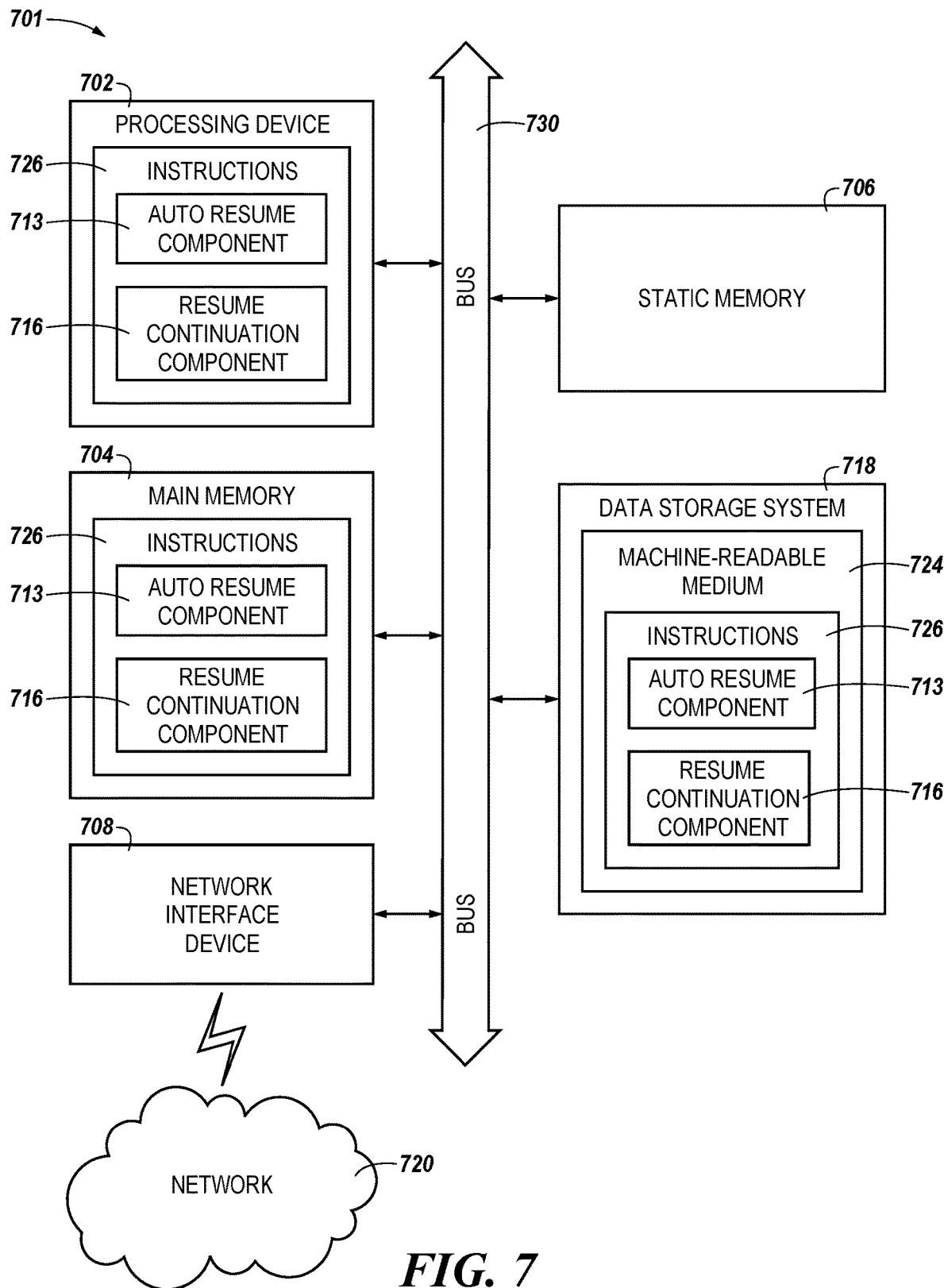
FIG. 7 is a block diagram of an example computer system in which embodiments of the present disclosure can operate.

FIG. 7 is a block diagram of an example computer system 701 in which embodiments of the present disclosure can operate. For example, FIG. 7 illustrates an example machine of a computer system 701 within which a set of instructions, for causing the machine to perform any one or more of the methodologies discussed herein, can be executed. In some embodiments, the computer system 701 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the auto resume component 113 and the resume continuation component 116 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 701 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

The processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), network processor, or the like. The processing device 702 can execute instructions 726 for performing the operations and steps discussed herein. The computer system 701 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 701, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to auto resume component 713 and the resume continuation component 716. While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
a memory component; and
a processing device, operatively coupled with the memory component, to:
    send a read command to the memory component while a program or erase operation being executed by the memory component is suspended; and
    send a resume continuation command to the memory component during execution of the read command and prior to a checkpoint for resuming the program or erase operation being met.

2. The system of claim 1, wherein the processing device is to receive data read from the memory component during execution of the read command concurrently with execution of the program or erase operation.

3. The system of claim 1, wherein the resume continuation command is an auto resume command.

4. A method, comprising:
receiving, by a memory component, a read command while a program or erase operation being executed by the memory component is suspended;
receiving, by the memory component, a resume continuation command prior to a checkpoint for resuming the program or erase operation being met; and
pausing, by the memory component, execution of the program or erase operation responsive to receiving the resume continuation command.

5. The method of claim 4, wherein the method includes resuming, by the memory component, execution of the program or erase operation responsive to the checkpoint being met.

6. The method of claim 4, wherein the method includes resuming, by the memory component, execution of the program or erase operation only after execution of the read command.

7. The method of claim 4, wherein the method includes resuming, by the memory component, execution of the program or erase operation before the read command is executed.

8. The method of claim 4, wherein the method includes triggering, by the memory component, a determination of whether the checkpoint has been met responsive to a request for page buffer resources.

9. The method of claim 8, wherein the page buffer resources are not used until requested.

10. The method of claim 4, wherein the method includes confirming, by the memory component, the resume continuation command has been received.

11. The method of claim 10, wherein the method includes confirming the resume continuation command has been received responsive to an amount of page buffer resources of the memory component being used.

12. A method, comprising:
    sending a read command to a memory component while a program or erase operation being executed by the memory component is suspended; and
    sending a resume continuation command to the memory component subsequent to a checkpoint for resuming the program or erase operation being met, wherein the checkpoint corresponds to an amount of page buffer resources of the memory component being used.

13. The method of claim 12, wherein the method includes executing the read command and a portion of the program or erase operation concurrently.

14. The method of claim 12, wherein the resume continuation command is sent to the memory component before the read command is sent to the memory component.

15. A system, comprising:
    a memory component to:
        receive a read command while a program or erase operation being executed by the memory component is suspended; and
        receive a resume continuation command subsequent to a checkpoint for resuming the program or erase operation being met, wherein the checkpoint corresponds to a request for page buffer resources of the memory component.

16. The system of claim 15, wherein the memory component is to resume execution of the program or erase operation responsive to receiving the resume continuation command.

17. The system of claim 15, wherein the memory component is to not activate page buffer resources of the memory component until the checkpoint has been met.

* * * * *